United States Patent
Yamanaka

[19]

[11] Patent Number: 5,952,127
[45] Date of Patent: Sep. 14, 1999

[54] METHOD OF FABRICATING A PHASE SHIFTING RETICLE

[75] Inventor: Koji Yamanaka, Tokyo, Japan

[73] Assignee: NEC Corporation, Tokyo, Japan

[21] Appl. No.: 07/932,714

[22] Filed: Aug. 20, 1992

[30] Foreign Application Priority Data

Aug. 22, 1991 [JP] Japan .................................. 3-209703

[51] Int. Cl.⁶ .................................................. G03F 9/00
[52] U.S. Cl. ............................................................. 430/5
[58] Field of Search ..................................................... 430/5

[56] References Cited

U.S. PATENT DOCUMENTS

| | | | |
|---|---|---|---|
| 4,612,072 | 9/1986 | Morrison et al. | 148/175 |
| 5,045,417 | 9/1991 | Okamoto | 430/5 |

OTHER PUBLICATIONS

Jul. 1990 Nikkei Microdevices No. 61, pp. 103–114.
IEEE Transactions on Electron Devices, vol. ED–29, No. 12, Dec. 1982 "Improving Resolution in Photolithography with a Phase–Shifting Mask".

*Primary Examiner*—Mark Chapman

[57] ABSTRACT

Disclosed is a method of fabricating a phase shifting reticle in which phase shifters cover alternatively apertures of opaque light shielding chrome layer formed on a transparent glass plate. The opaque light shielding chrome layers are formed on a partial surface of the transparent glass plate. Both the opaque light shielding chrome layers and apertures thereof are covered with a thin silicon dioxide layer. A resist is applied on an entire surface of the thin silicon dioxide layer, followed by a patterning of the resist. The phase shifters of silicon dioxide are selectively formed in apertures of the resist pattern by use of a liquid phase epitaxial growth, after which the resist pattern is removed. The phase shifter has an even thickness and a flat surface so as to permit a precise optical phase shift. The liquid phase epitaxial growth is used at a low temperature so that no deformation and no peel of the opaque light shielding chrome layer is occurred. The thickness of the phase shifter may easily controlled due to a low growth rate of the silicon dioxide layer serving as the phase shifter.

5 Claims, 2 Drawing Sheets

METHOD OF FABRICATING A PHASE SHIFTING RETICLE

BACKGROUND OF THE INVENTION

The invention relates to a method of fabricating a phase shifting reticle, and more particularly to a method of fabricating a phase shifter.

Some types of phase shifting reticles have been proposed and disclosed in July 1990 NIKKEI MICRODEVICES No. 61, pp.103–114. One of those has a following structure. A conductive layer 2 covers an entire surface of a glass plate 1 to prevent electron charging by electron-beam lithography. Opaque chrome layers 3 and apertures cover the conductive layer 2 to define a desired pattern. The apertures are alternatively covered with transparent phase shifting layers 4, or phase shifters. The lights transmitted through adjacent apertures have a different phase of 180 degree with one another.

The conventional fabrication processes of the phase shifting reticle are illustrated in FIGS. 1A to 1C. The glass plate 1 is covered with the conductive layer 2, if required. The opaque chrome layers 3 are formed on the conductive layer 2 to define the intensity pattern so that a formation of the ordinary reticle is completed. This structure is illustrated in FIG. 1A. A transparent silicon dioxide layer 4 ($SiO_2$ layer) which serves as a phase shifter is formed on the entire surface of the reticle by use of either a chemical vapor deposition method or a spin coating method. A resist 5 is applied on the silicon dioxide layer 4 by use of the spin coating method. As shown in FIG. 1B, the resist 5 is subjected to a desired patterning by use of electron-beam lithography exposure 7, followed by a deposition. The silicon dioxide layer 4 is patterned by etching, after which the resist 5 is completely removed whereby a formation of a reticle with phase shifters is competed as shown in FIG. 1C.

When an optical wavelength of 435.8 nm is used, the phase shifter of silicon dioxide requires an even thickness of approximately 470 nm ±10 nm. It is required that the thickness of the phase shifter is even in the range of ±2 percent of a desired thickness. A precise control of the phase shifter thickness is also required.

The set forth conventional fabrication methods of the phase shifting reticle is engaged with following problems. The reticle formed by the chemical vapor deposition method has an uneven surface in the range of ±5 percent so that it is difficult to realize a desired optical phase shift. While, the spin coating method requires a high temperature treatment. It is required that the silicon dioxide layer 4 is sintered at 400 degree temperature. This high temperature sintering treatment causes a deformation and a peel of the opaque chrome layer. Also, the reticle formed by the spin coating method has a relatively large different thickness at a center portion and an edge portion with one another. The large different of the thickness causes a difficulty of realizing a desired optical phase shift.

SUMMARY OF THE INVENTION

Accordingly, it is an object of the present invention to provide a method of fabricating a phase shifting reticle in which a phase shifter has an even thickness and a flat surface to realize a desired optical phase shift.

It is another object of the present invention to provide a method of fabricating a phase shifting reticle without a deformation and a peel of an opaque chrome layer.

The above and other objects, features, and advantageous of the present invention will be apparent from following descriptions.

There is provided a novel method of fabricating a phase shifting reticle by use of a liquid phase epitaxial growth method to prevent the use of a high temperature treatment. Also, the novel fabrication method of the present invention permits controlling easily an even thickness of the phase shifter due to a low growth rate of a silicon dioxide layer serving as the phase shifter.

The novel method of fabricating a phase shifting reticle according to the present invention essentially comprises the following steps. A glass plate serves as a body of the reticle. Opaque chrome layers and apertures are alternatively formed on the glass plate by normal processes to define a desired pattern. A thin silicon dioxide layer is formed by use of a chemical vapor deposition method on an entire surface of the reticle so that the opaque chrome layers and the aperture are covered with the thin silicon dioxide layer. After that, a resist is applied on an entire surface of the thin silicon dioxide layer. The resist is so patterned that a partial surface region of the thin silicon dioxide layer on which a phase shifter will be formed is exposed. A silicon dioxide layer is formed by a liquid phase epitaxial growth method using a supersaturated liquid solution of silicon dioxide The remaining resist is completely removed so that the apertures between the chrome layers are alternatively covered with the silicon dioxide layers and apertures of the silicon dioxide layers. The silicon dioxide layer has a desired even thickness. Also, the silicon dioxide layer serves as the phase shifter which permits a precise optical phase shift of 180 degree.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

Figure 1A:
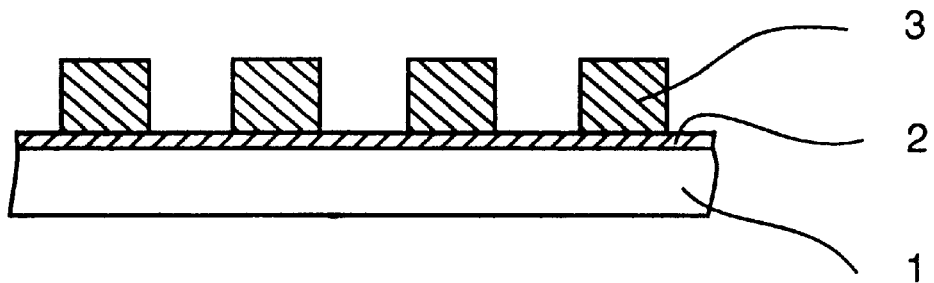
FIGS. 1A to 1C are fragmentary cross-sectional elevation views illustrative of sequential process steps involved in the conventional method of fabricating the phase shifting reticle.
Figure 1B:
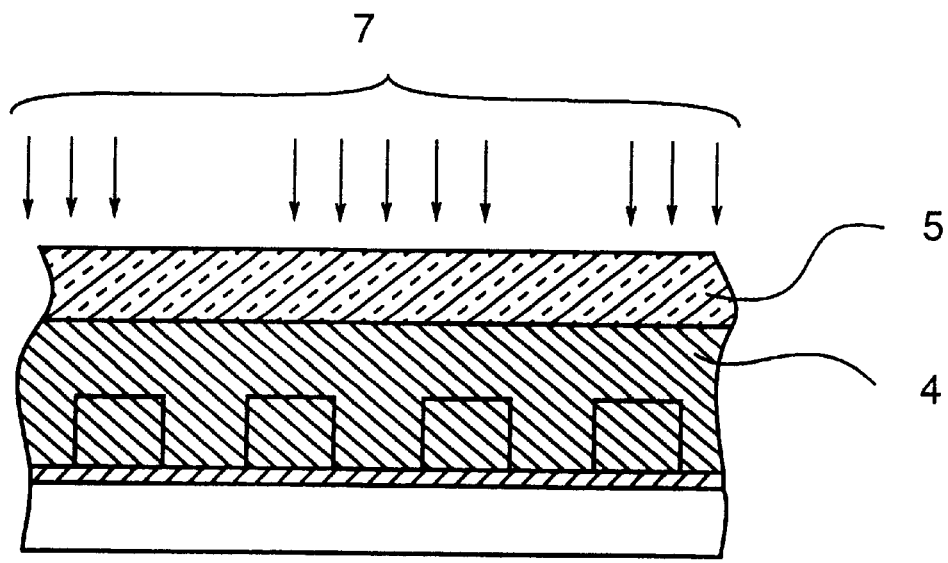
Figure 1C:
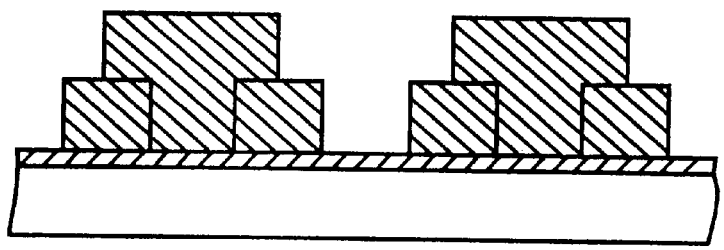
Figure 2A:
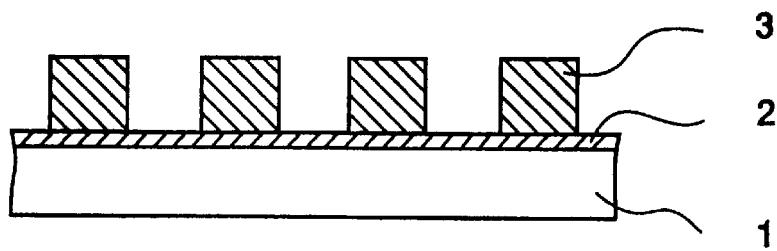
FIGS. 2A to 2E are fragmentary cross-sectional elevation views illustrative of sequential process steps involved in a novel method of fabricating a phase shifting reticle according to the present invention.

In FIG. 2A, a glass plate 1 serves as a body of a riticle. A transparent conductive layer 2 covers an entire surface of the glass plate 1 so as to prevent electron charging caused by electron-beam lithography. If it is desirable to do so, the conductive layer formation may be omitted. Opaque chrome layers 3 and apertures are alternatively formed on the transparent conductive layer 2 to define a desired pattern. The reticle illustrated in FIG. 2A may be fabricated by the normal processes.

Figure 2B:
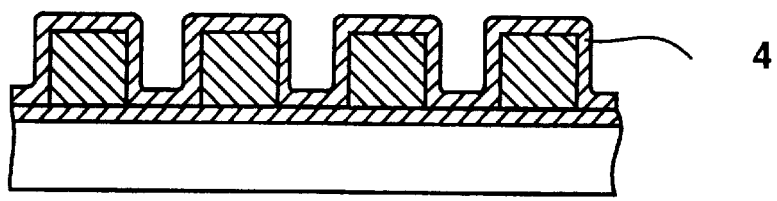

In FIG. 2B, a thin silicon dioxide layer 4 of a thickness of approximately 50 nm is formed at a 200 degree low temperature by use of a low pressure chemical vapor deposition method. In replacement of the above method, the thin silicon dioxide 4 may be formed at a 100 degree low temperature by use of an optical chemical vapor deposition method. The opaque chrome layers 3 and apertures are completely covered with the continuous thin silicon dioxide layer 4.

Figure 2C:
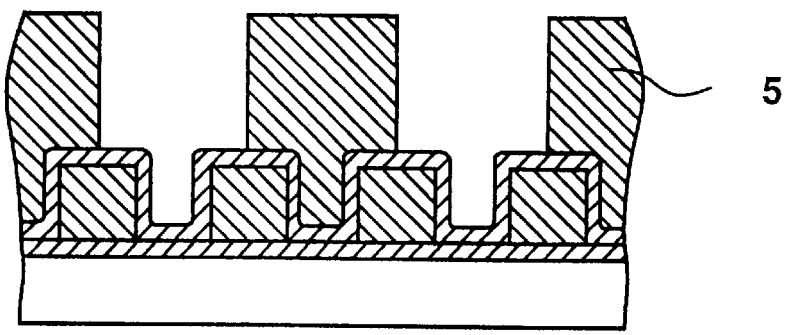

In FIG. 2C, a resist 5 is applied on an entire surface of the thin silicon dioxide layer 4. Continuously, the resist 5 is patterned by use of electron-beam lithography exposure, followed by a development, with which a part of the resist 5 is so removed that a partial surface region of the thin silicon dioxide layer 4 on which a phase shifter 6 will be formed is exposed.

Figure 2D:
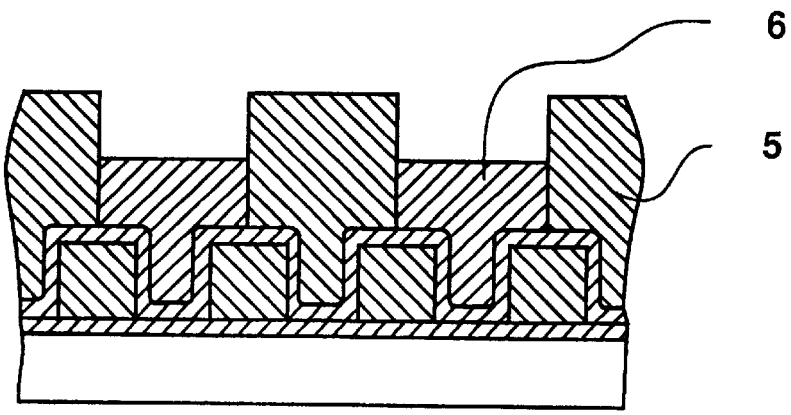

In FIG. 2D, silicon dioxide layers 6 which have a desired even thickness are grown by use of a liquid phase epitaxial growth method so that phase shifters are formed in apertures between the remaining resists.

The liquid phase epitaxial growth method of this embodiment is disclosed in the specifications of the Japanese Patent Application No. 1-236544. In this method, silanol ($Si(OH)_4$) is sintered by use of a hydrosilicofluoric acid solution of approximately 3.5 mol at a 150 degree low temperature to produce silicon dioxide. The silicon dioxide of power dissolves in a solution at a 30 degree temperature so that a supersaturated solution of silicon dioxide is produced. The liquid phase epitaxial growth uses the supersaturated solution of silicon dioxide. To support the supersaturated state, a boric acid solution of a concentration of approximately 0.1 mol/l is continuously added into the solution at a 10 cc an hour rate. The supersaturated solution ordinary is also circulated with a Teflon filter of 0.2 micro meters to remove a particle of 0.2 micro meters or larger diameter.

The reticle is immersed in the supersaturated solution which maintained at a constant temperature of 35 degree for 11.8 hours in which a silicon dioxide growth rate is 40 nm an hour. Consequently, the silicon dioxide layer 6 of a thickness of approximately 472 nm is selectively formed at the apertures of the remaining resist 5. The silicon dioxide layer thickness is even in the range of ±0.05 percent. Such a precise thickness of the silicon dioxide layer permits a desired optical phase shifting. The silicon dioxide layer 6 has a flat surface to realize a good optical phase shifting.

Figure 2E:
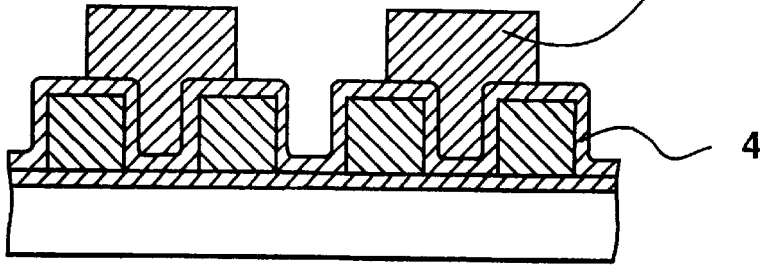

In FIG. 2E, the remaining resist 5 is completely removed so that the apertures between the chrome layers 3 are alternatively covered with the silicon dioxide layers 6 and apertures between the silicon dioxide layers 6. Then, a fabrication of a reticle with phase shifters is completed.

In this embodiment, the 472 nm thickness of the phase shifter is determined in association with a light source of a 435.8 nm wavelength. The thickness of the phase shifter may be varied by matching the variation of light source wavelengths, for instance, 248.4 nm or 365 nm etc.

The present invention uses a liquid phase epitaxial growth to obtain an excellent flatness of the surface of the resultant silicon dioxide layer which is required to realize an excellent property of the phase shifter. It is difficult to form the silicon dioxide layers by the liquid phase epitaxial growth both on the chrome light shielding layers and on the transparent glass substrate. That is why the silicon oxide thin film is formed by the chemical vapor deposition on both the glass substrate and the chrome light shielding layers for the subsequent liquid phase epitaxial growth of the silicon dioxide layer. Namely, the chemical vapor deposition of the silicon dioxide thin film on both the glass substrate and the chrome layers allows the subsequent liquid phase epitaxial growth of the silicon dioxide layer having the leveled surface.

Accordingly, the method of fabricating the phase shifting reticle of the present invention uses the liquid phase epitaxial growth method so that no high temperature treatment is accomplished. This may prevent the deformation and the peel of the chrome layers. Also, the silicon dioxide growth rate is low at 40 nm an hour. The reticle at its surface has a good evenness in the range of ±0.05 percent of the thickness. Consequently, the method of fabricating the phase shifting reticle according to the present invention permits the thickness of the phase shifter to easily be controlled so that a desired thickness of the phase shifter is obtained.

The conditions in the liquid phase epitaxial growth such as a temperature, a growth time, a growth rate, a solution concentration and the others may be varied by matching the conditions.

Whereas modifications of the present invention will no doubt be apparent to a person of ordinary skilled in the art, it is to be understood that the embodiments shown and described by way of illustration are by no means intended to be considered in a limiting sense. Accordingly, it is to be intended by the claims to cover all modifications of the invention which fall within the sprite and scope of the invention.

What is claimed is:

1. A method of fabricating a phase shifter of a reticle comprising the steps of:

forming both light shielding layers and apertures on a substrate of an optically transparent material;

forming a thin film of silicon dioxide by a chemical vapor deposition on said light shielding layers and on parts of a surface of said substrate which are exposed through said apertures;

applying a photo-resist film over an entire surface of said silicon dioxide film for a subsequent patterning so that said apertures of said light shielding layers are alternatively overlaid by remaining portions of said photo-resist film and its apertures;

selectively forming a phase shifter of silicon dioxide on a part of a surface of said silicon dioxide thin film exposed through said apertures of said photo-resist film, said selective forming being by a liquid phase epitaxial growth; and removing said remaining photo-resist film.

2. The method as claimed in claim 1, wherein said chemical vapor deposition to form said silicon dioxide thin film is a low pressure chemical vapor deposition.

3. The method as claimed in claim 1, wherein said patterning of said photo-resist film is accomplished by an electron-beam lithography and a subsequent development.

4. The method as claimed in claim 1, wherein said liquid phase epitaxial growth uses a supersaturated solution of silicon dioxide.

5. The method as claimed in claim 1, further comprising the step of covering an entire surface of said substrate with a conductive transparent layer prior to said formation of said chrome light shielding layers.

* * * * *